US011799203B2

(12) United States Patent
Wu et al.

(10) Patent No.: US 11,799,203 B2
(45) Date of Patent: Oct. 24, 2023

(54) MODIFIED-MATERIAL-BASED HIGH-PRECISION COMBINED ANTENNA FOR SATELLITE NAVIGATION AND COMMUNICATIONS

(71) Applicant: Shanghai Huace Navigation Technology LTD., Shanghai (CN)

(72) Inventors: Ding Wu, Shanghai (CN); Bo Lv, Shanghai (CN); Wentao Zhong, Shanghai (CN)

(73) Assignee: SHANGHAI HUACE NAVIGATION TECHNOLOGY LTD., Shanghai (CN)

( * ) Notice: Subject to any disclaimer, the term of this patent is extended or adjusted under 35 U.S.C. 154(b) by 548 days.

(21) Appl. No.: 17/257,025

(22) PCT Filed: Dec. 24, 2019

(86) PCT No.: PCT/CN2019/127825
§ 371 (c)(1),
(2) Date: Dec. 30, 2020

(87) PCT Pub. No.: WO2021/127969
PCT Pub. Date: Jul. 1, 2021

(65) Prior Publication Data
US 2021/0376467 A1 Dec. 2, 2021

(30) Foreign Application Priority Data
Dec. 23, 2019 (CN) .......................... 201911334865.0

(51) Int. Cl.
*H01Q 5/307* (2015.01)
*H01Q 1/22* (2006.01)
(Continued)

(52) U.S. Cl.
CPC ........... *H01Q 5/307* (2015.01); *H01Q 1/2291* (2013.01); *H01Q 1/38* (2013.01); *H01Q 1/48* (2013.01);
(Continued)

(58) Field of Classification Search
CPC ........ H01Q 5/307; H01Q 1/2291; H01Q 1/38; H01Q 1/48; H01Q 9/42; H01Q 23/00;
(Continued)

(56) References Cited

U.S. PATENT DOCUMENTS

2016/0261047 A1\* 9/2016 Wallace ................. H01Q 1/521
2019/0123436 A1\* 4/2019 Martinez Ortigosa .....................
H01Q 21/28

FOREIGN PATENT DOCUMENTS

CN 106785320 A 5/2017
CN 207217783 U 4/2018
(Continued)

*Primary Examiner* — Khai M Nguyen
(74) *Attorney, Agent, or Firm* — Bayramoglu Law Offices LLC

(57) ABSTRACT

A modified-material-based high-precision combined antenna for satellite navigation and communications includes a high-frequency satellite navigation antenna metal radiating surface, a low-frequency satellite navigation antenna metal radiating surface, a WIFI/Bluetooth antenna metal radiating surface, a PCB, a shielding metal cavity and an injection molded modified-material-based substrate. The low-frequency satellite navigation antenna metal radiating surface is located between the high-frequency satellite navigation antenna metal radiating surface and the PCB. The WIFI/Bluetooth antenna metal radiating surface is located on a side of the low-frequency satellite navigation antenna metal radiating surface. The injection molded modified-material-based substrate is made of polyphenyl ether doped with a modified material, and the modified material has a relative permittivity of 2.65 and a density of 1.06 g/cm³. The (Continued)

injection molded modified-material-based substrate includes a first injection molded modified-material-based substrate and a second injection molded modified-material-based substrate.

10 Claims, 4 Drawing Sheets

(51) Int. Cl.
  *H01Q 1/38* (2006.01)
  *H01Q 1/48* (2006.01)
  *H01Q 9/42* (2006.01)
  *H01Q 23/00* (2006.01)
  *H03F 3/19* (2006.01)
(52) U.S. Cl.
  CPC ............... *H01Q 9/42* (2013.01); *H01Q 23/00* (2013.01); *H03F 3/19* (2013.01); *H03F 2200/171* (2013.01); *H03F 2200/451* (2013.01)

(58) Field of Classification Search
  CPC ...... H01Q 9/0428; H01Q 9/045; H01Q 21/28; H01Q 21/30; H01Q 1/36; H01Q 21/00; H01Q 21/0006; H03F 3/19; H03F 2200/171; H03F 2200/451; G01S 19/36
  USPC .................................................. 343/700 MS
  See application file for complete search history.

(56) References Cited

FOREIGN PATENT DOCUMENTS

| | | |
|---|---|---|
| CN | 105024137 B | 10/2018 |
| JP | 2017195433 A | 10/2017 |

\* cited by examiner

MODIFIED-MATERIAL-BASED HIGH-PRECISION COMBINED ANTENNA FOR SATELLITE NAVIGATION AND COMMUNICATIONS

CROSS REFERENCE TO THE RELATED APPLICATIONS

This application is the national phase entry of International Application No. PCT/CN2019/127825, filed on Dec. 24, 2019, which is based upon and claims priority to Chinese Patent Application No. 201911334865.0, filed on Dec. 23, 2019, the entire contents of which are incorporated herein by reference.

TECHNICAL FIELD

The present invention relates to the field of satellite navigation, and more particularly, to a modified-material-based high-precision combined antenna for satellite navigation and communications.

BACKGROUND

With the advancements in science and technology increasing, information like precise accuracy in location and time have been highlighted as extremely important. Beidou navigation satellite system is rapidly developing and is being widely used in the active areas of high-precision surveying and mapping, self-driving systems and drones, which becomes the impetus for the construction and coverage of the Beidou-3 satellite navigation system.

An antenna is the front-end component of a receiver. Thus, the performance of the receiver is highly related to the performance of the antenna. In this regard, manufacturers and users pay more attention to the performance of the global navigation satellite system (GNSS) antennas for receiving satellite signals. The performance parameters of the antenna directly affect the positioning result. The better the positioning accuracy, the wider the applicable range. Heretofore, the millimeter-level positioning accuracy has been achieved, but a single frequency band has been the engineering bottleneck of the navigation satellite system. Many receivers require GNSS antennas to receive dual-band signals to improve positioning accuracy, and such a trend, thus, causes a receiving system with a receiver capable of simultaneously receiving signals from multiple satellite systems and communication systems to become the mainstream of research on GNSS antenna reception.

SUMMARY

In view of the above-mentioned problems, an objective of the present invention is to provide a modified-material-based high-precision combined antenna for satellite navigation and communications. In order to better popularize the application of high-precision satellite navigation antennas, the present invention proposes a low-cost, high-precision combined antenna for satellite navigation and communications, which is suitable for mass production. In the present invention, engineering plastic doped with a modified material is employed to integrally form the substrate through injection molding, and then the combined antenna is integrally formed through an electroplating process. This particular process greatly reduces the production cost, and can be widely used in satellite positioning and navigation, satellite communications, mobile communications and other related fields.

To achieve the above-mentioned objective, the present invention provides the following technical solutions. A modified-material-based high-precision combined antenna for satellite navigation and communications includes a high-frequency satellite navigation antenna metal radiating surface, a low-frequency satellite navigation antenna metal radiating surface, a Wireless Fidelity (WIFI)/Bluetooth antenna metal radiating surface, a printed circuit board (PCB) and a shielding metal cavity. The low-frequency satellite navigation antenna metal radiating surface is located between the high-frequency satellite navigation antenna metal radiating surface and the PCB. The WIFI/Bluetooth antenna metal radiating surface is located on a side of the low-frequency satellite navigation antenna metal radiating surface.

Preferably, the modified-material-based high-precision combined antenna further includes an injection molded modified-material-based substrate. The injection molded modified-material-based substrate is made of polyphenyl ether doped with a modified material, and the modified material has a relative permittivity of 2.65 and a density of 1.06 g/cm$^3$. The injection molded modified-material-based substrate includes an injection molded modified-material-based substrate A and an injection molded modified-material-based substrate B.

Preferably, the high-frequency satellite navigation antenna metal radiating surface is electroplated on the modified-material-based substrate A to form a high-frequency substrate board, and the low-frequency satellite navigation antenna metal radiating surface is electroplated on the modified-material-based substrate B to form a low-frequency substrate board.

Preferably, each of the high-frequency satellite navigation antenna metal radiating surface and the low-frequency satellite navigation antenna metal radiating surface is composed of a polygon, wherein a long side of the polygon extends out to form a branch for frequency adjustment.

Preferably, the high-frequency substrate board and the low-frequency substrate board are installed in combination. Each of the four corners of the high-frequency substrate board has a 2 mm screw hole, and the center of the high-frequency substrate board has a 4 mm screw hole. The high-frequency substrate board and the low-frequency substrate board are fixed to the PCB through screws.

Preferably, the reverse side of the high-frequency substrate board is plated with metal and configured as a ground plane, and the inner wall of the central screw hole is plated with metal and contacts the ground plane of the high-frequency substrate board. Four through-holes are formed 8 mm from the center of the high-frequency substrate board, and a metal round pin is welded to the four through-holes and used as an antenna feed.

Preferably, the reverse side of the low-frequency substrate board is entirely plated with metal and configured as a ground plane, and the shape of the reverse side of the low-frequency substrate board is the same as the shape of the low-frequency substrate board. The inner wall of the screw hole, in the center of the low-frequency substrate board, is plated with metal and contacts the ground plane of the low-frequency substrate board. Four through-holes are formed 15 mm from the center of the low-frequency substrate board, and a metal round pin is welded to the four through-holes and used as the antenna feed.

Preferably, the WIFI/Bluetooth antenna metal radiating surface is electroplated on a side of a low-frequency substrate.

Preferably, a WIFI/Bluetooth antenna is a passive antenna with an inverted-F antenna structure and has a short-circuit point and a feed point.

Preferably, the modified-material-based high-precision combined antenna further includes a PCB feed network and an amplifying filter circuit. The amplifying filter circuit includes a pre-filter and a two-stage amplifier. A signal is synthesized after a high-frequency signal and a low-frequency signal separately pass through the pre-filter and the first-stage amplifier, and then the signal is output through the second-stage amplifier to ensure that the satellite navigation receiver obtains sufficient satellite signal strength.

Compared with the prior art, the present invention has the following advantages. In the present invention, the engineering plastic doped with a modified material is employed to integrally form the substrate through injection molding, and then the combined antenna is integrally formed through an electroplating process, which greatly reduces the production cost, and can be widely used in satellite positioning and navigation, surveying and mapping, mobile communications and other related fields.

DETAILED DESCRIPTION OF THE EMBODIMENTS

Figure 1:
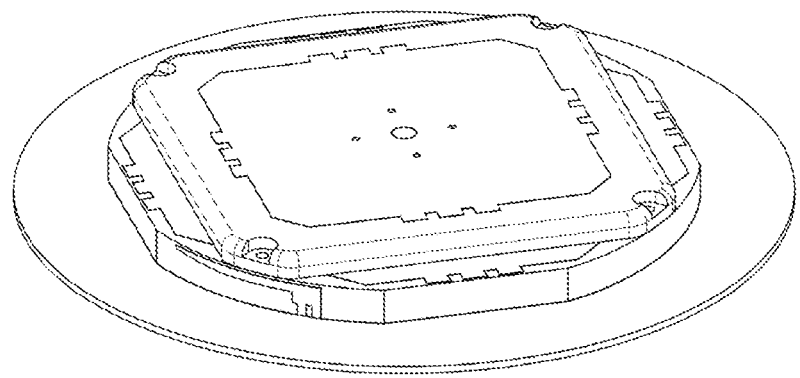
FIG. 1 is a perspective view of the front side of the present invention.

The technical solutions in the embodiments of the present invention will be described clearly and completely with reference to the drawings in the embodiments of the present invention. Obviously, the described embodiments are only a part of the embodiments of the present invention, rather than all the embodiments. Based on the embodiments of the present invention, all other embodiments obtained by those of ordinary skill in the art without creative efforts shall fall within the scope of protection of the present invention.

In the description of the present invention, it should be noted that the terms "upper", "lower", "inner", "outer", "front end", "rear end", "two ends", "one end", "the other end" and the like indicating orientation or positional relationships are based on the orientation or positional relationship shown in the drawings and only used to facilitate the description of the present invention and simplify the description, rather than to indicate or imply that the referred device or element must have a specific orientation, be configured and operated in a specific orientation, and therefore, cannot be construed as a limitation to the present invention. In addition, the terms "first", "second" and the like are only used for descriptive purposes, and cannot be construed as indicating or implying relative importance.

In the description of the present invention, it should be noted that the terms "install", "be provided with", "connect", and the like should be understood in a broad sense unless otherwise clearly defined and limited. For example, a "connection" can be a fixed connection, a detachable connection, or an integral connection; it can be a mechanical connection or an electrical connection; it can be a direct connection or an indirect connection through an intermediate medium, or it can be a communication between two elements. For those of ordinary skill in the art, the specific meanings of the above-mentioned terms in the present invention can be understood according to specific situations.

The present invention provides a modified-material-based high-precision combined antenna for satellite navigation and communications. The antenna includes a high-precision satellite navigation antenna metal radiating surface, a WIFI/Bluetooth antenna metal radiating surface, an injection molded modified-material-based substrate, a PCB feed network, an amplifying filter circuit and a shielding metal cavity. The high-precision satellite navigation antenna metal radiating surface is electroplated on two modified-material-based substrates of different sizes. The WIFI/Bluetooth antenna metal radiating surface is electroplated on a side of a large substrate. The antenna metal radiating surface is connected to the PCB feed network and the amplifying filter circuit through an internal metal structure, and the shielding metal cavity covers the PCB to protect the internal circuit. In the present invention, the injection molded modified-material-based substrate is made of polyphenyl ether doped with a modified material, and the modified material has a relative permittivity of 2.65 and a density of 1.06 g/cm$^3$. The modified-material-based substrate is injection molded to obtain an off-white overall appearance and is superior to a traditional polytetrafluoroethylene (F4B) substrate in weight.

In the present invention, in consideration of the difference in bandwidths of high-frequency and low-frequency satellite navigation signals, the antenna has two kinds of the injection molded modified-material-based substrate with different thickness, wherein the low-frequency substrate has a thickness of 6 mm, and the high-frequency substrate has a thickness of 4 mm. In order to effectively reduce the height of the antenna edge, the four sides of the high-frequency substrate are formed with rounded corners. The high-precision satellite navigation antenna metal radiating surface is composed of a high-frequency metal radiating surface and a low-frequency metal radiating surface. The high-frequency metal radiating surface is electroplated on a smaller modified-material-based substrate to form a high-frequency substrate board, while the low-frequency metal radiating surface is electroplated on a larger modified-material-based substrate to form a low-frequency substrate board. Preferably, each of the high-frequency metal radiating surface and the low-frequency metal radiating surface is composed of a polygon, and a long side of the polygon extends out to form a branch for frequency adjustment. Optionally, the metal radiating surface can also be circular or polygonal.

In the present invention, the high-frequency substrate board on the upper side and the low-frequency substrate board on the lower side are installed in combination. The high-frequency substrate board and the low-frequency substrate board are fixed to the PCB through screws at the four corners. The screw holes are configured as counterbore holes to effectively reduce the overall height of the antenna.

In the present invention, the WIFI/Bluetooth antenna metal radiating surface is electroplated on a side of the low-frequency substrate. Preferably, the WIFI/Bluetooth antenna is a passive antenna with an inverted-F antenna structure, and has a short-circuit point and a feed point.

In the present invention, after receiving electromagnetic waves traveling through space, the high-precision satellite navigation antenna metal radiating surface feeds corresponding signals to 90-degree bridges for equal-power division through four feed ports in the center of the high-frequency and low-frequency substrate board. Two signals are combined into one signal through a 90-degree bridge for equal-power division, and the other two signals are combined into one signal through another 90-degree bridge for equal-power division. A right-handed circularly polarized signal is finally synthesized at the antenna interface after the two combined signals pass through a 90-degree phase-shifting network and a 90-degree bridge for equal-power division.

In the present invention, the amplifying filter circuit includes a pre-filter and a two-stage amplifier. A signal is synthesized after a high-frequency signal and a low-frequency signal separately pass through the pre-filter and the first-stage amplifier, and then the signal is output through the second-stage amplifier to ensure that the satellite navigation receiver obtains sufficient satellite signal strength.

Embodiments

Figure 2:
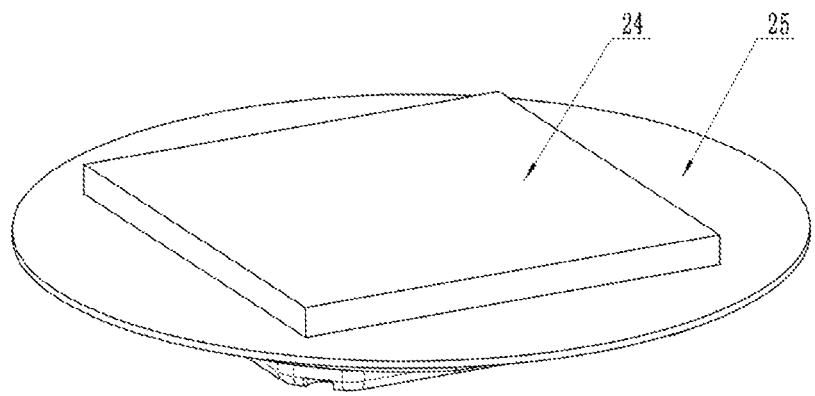
FIG. 2 is a perspective view of the reverse side of the present invention.
Figure 3:
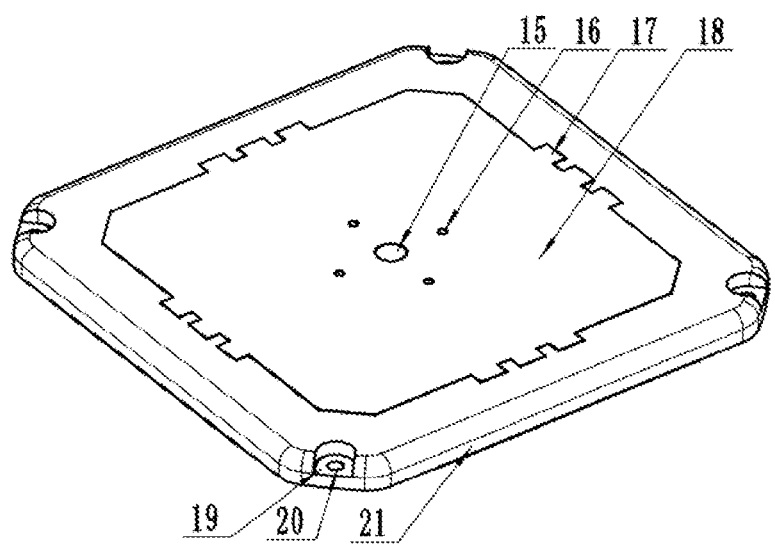
FIG. 3 is a schematic view of the front side of the high-frequency substrate board of the present invention.
Figure 4:
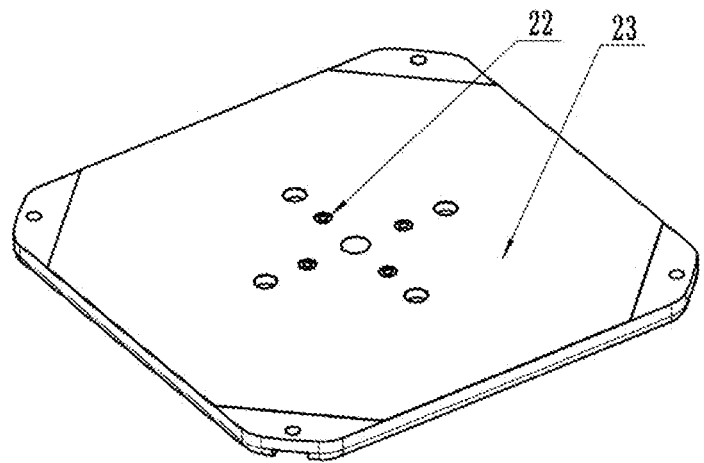
FIG. 4 is a schematic view of the reverse side of the high-frequency substrate board of the present invention.
Figure 5:
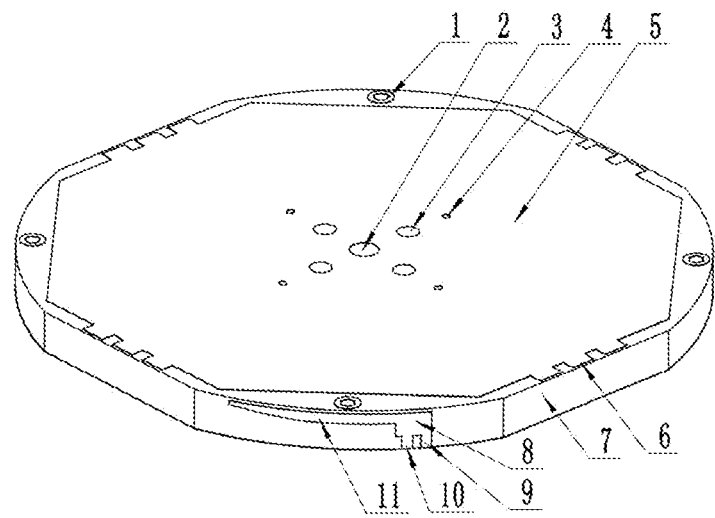
FIG. 5 is a schematic view of the front side of the low-frequency substrate board of the present invention.
Figure 6:
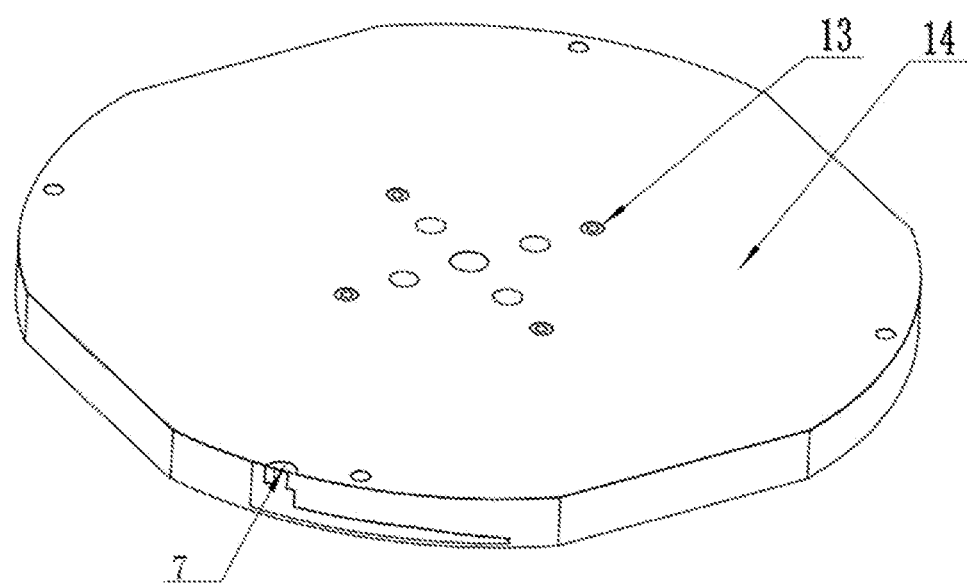
FIG. 6 is a schematic view of the reverse side of the low-frequency substrate board of the present invention.
Figure 7:
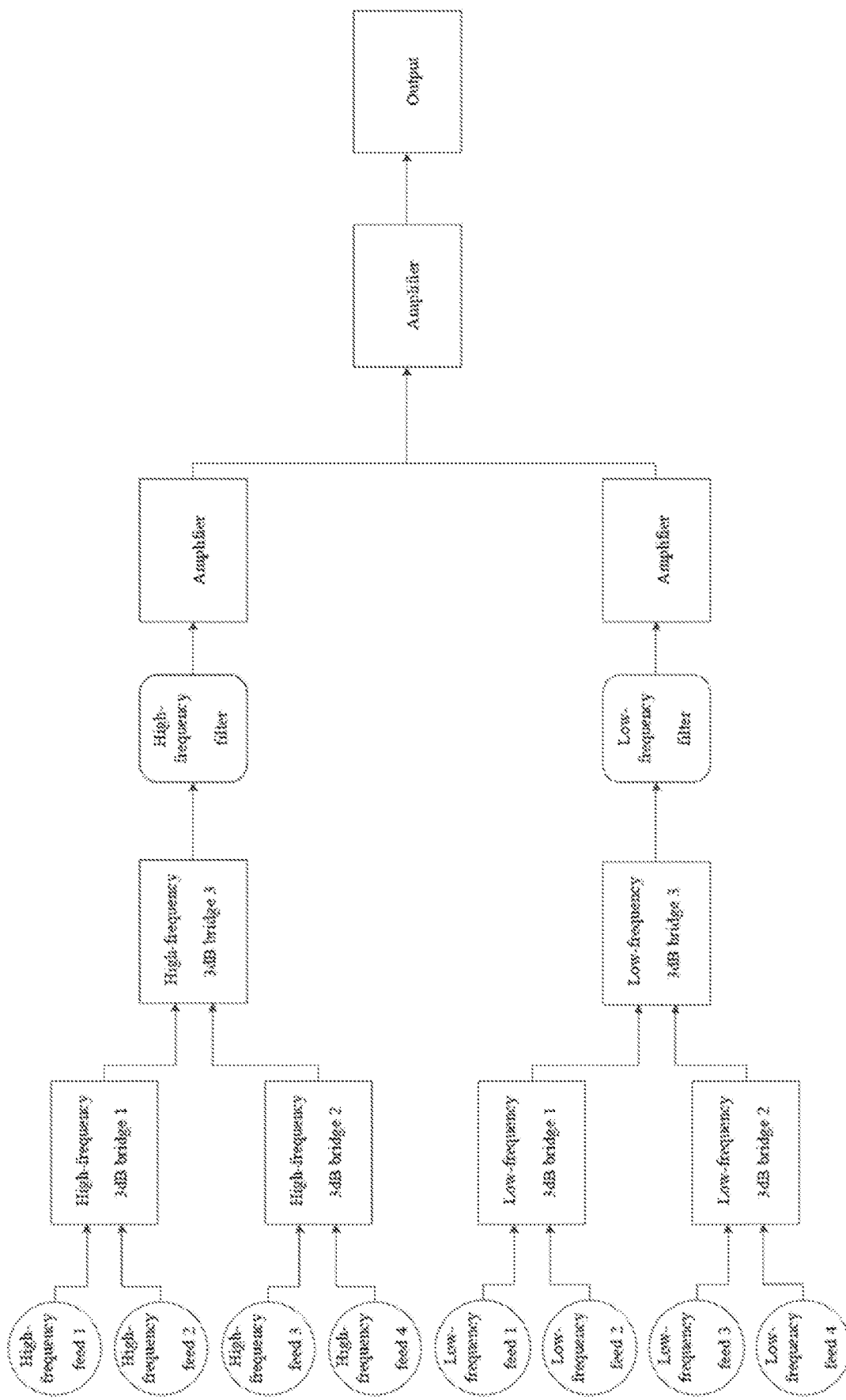
FIG. 7 is a block diagram of the PCB feed network and the amplifying filter circuit of the present invention.

Referring to FIGS. 1-7, a modified-material-based high-precision combined antenna for satellite navigation and communications includes the high-frequency satellite navigation antenna metal radiating surface 18, the low-frequency satellite navigation antenna metal radiating surface 5, the WIFI/Bluetooth antenna metal radiating surface 8, the injection molded modified-material-based substrate, the PCB feed network, the amplifying filter circuit and the shielding metal cavity 24. The injection molded modified-material-based substrate is made of polyphenyl ether doped with a modified material, and the modified material has a relative permittivity of 2.65 and a density of 1.06 g/cm$^3$. The modified-material-based substrate is injection molded to obtain an off-white overall appearance and is superior to a traditional polytetrafluoroethylene (F4B) substrate in weight. The injection molded modified-material-based substrate includes the injection molded modified-material-based substrate A (high-frequency substrate 21) and the injection molded modified-material-based substrate B (low-frequency substrate 7). In the present invention, the through-holes 4, 16, 13, 22 are provided for pins to pass through the substrates. Specifically, the through-holes 4, 13 are provided for pins of the low-frequency substrate board to pass through the substrates, and the through-holes 22, 16 are reserved for pins of the high-frequency substrate board to pass through the substrates. The reference numerals 11 and 8 both indicate the WIFI/Bluetooth antenna metal radiating surfaces.

In the present embodiment, the high-precision satellite navigation antenna metal radiating surface includes the high-frequency satellite navigation antenna metal radiating surface 18 and the low-frequency satellite navigation antenna metal radiating surface 5 that are fixed through the screw hole 1. The high-frequency satellite navigation antenna metal radiating surface 18 is electroplated on the smaller modified-material-based substrate A 21 to form a high-frequency substrate board, while the low-frequency metal radiating surface 5 is electroplated on the larger modified-material-based substrate B 7 to form a low-frequency substrate board. Each of the high-frequency satellite navigation antenna metal radiating surface 18 and the low-frequency satellite navigation antenna metal radiating surface 5 is composed of a polygon, and a long side of the polygon extends out to form the branch 17 and the branch 6 for frequency adjustment. Optionally, the metal radiating surface can also be circular or polygonal. The high-frequency substrate board on the upper side and the low-frequency substrate board on the lower side are installed in combination. Each of the four corners of the high-frequency substrate board has the 2 mm screw hole 19, and the center of the high-frequency substrate board has the 4 mm screw hole 15 for assembling screws. The high-frequency substrate board and the low-frequency substrate board are fixed to the PCB 25 through the screws. The screw holes 20 are configured as counterbore holes to effectively reduce the overall height of the antenna. Preferably, the reverse side of the high-frequency substrate board is plated with metal and configured as the ground plane 23, and the inner wall of the central screw hole 15 is plated with metal and contacts the ground plane 23 of the high-frequency substrate board. Four through-holes 16 are formed 8 mm from the center of the high-frequency substrate board, and a metal round pin is welded to the four through-holes 16 and used as an antenna feed. The reverse side of the low-frequency substrate board is entirely plated with metal and configured as the ground plane 14, and the shape of the reverse side of the low-frequency substrate board is the same as the shape of the low-frequency substrate board. The inner wall of the screw hole 2 in the center of the low-frequency substrate board is plated with metal and contacts the ground plane 14 of the low-frequency substrate board. Four through-holes 4 are formed 15 mm from the center of the low-frequency substrate board, and a metal round pin is welded to the four through-holes 4 and used as the antenna feed.

In the present embodiment, the metal radiating surface 8 of the WIFI/Bluetooth antenna is electroplated on a side of the low-frequency substrate 7. The WIFI/Bluetooth antenna is a passive antenna with an inverted-F antenna structure, and has the short-circuit point 9 and the feed point 10. In addition, a recess is provided on the metal bottom surface of the modified-material-based substrate B 7 at the Bluetooth feed point to avoid short-circuiting between the feed point and the ground plane. After receiving electromagnetic waves traveling through space, the high-precision satellite navigation antenna metal radiating surface feeds corresponding signals to 90-degree bridges for equal-power division through four feed ports in the center of the high-frequency and low-frequency substrate board. Two signals are combined into one signal through a 90-degree bridge for equal-power division, and the other two signals are combined into one signal through another 90-degree bridge for equal-power division. A right-handed circularly polarized signal is finally synthesized at the antenna interface after the two combined signals pass through a 90-degree phase-shifting network and a 90-degree bridge for equal-power division. The amplifying filter circuit includes a pre-filter and a two-stage amplifier. A signal is synthesized after a high-frequency signal and a low-frequency signal separately pass through the pre-filter and the first-stage amplifier, and then the signal is output through the second-stage amplifier to ensure that the satellite navigation receiver obtains sufficient satellite signal strength. In the present invention, the engineering plastic doped with a modified material is employed to integrally form the substrate through injection molding, and then the combined antenna is integrally formed through an electroplating process, which greatly reduces the production cost, and can be widely used in satellite positioning and navigation, satellite communications, mobile communications and other related fields.

For those skilled in the art, it is obvious that the present invention is not limited to the details of the foregoing exemplary embodiments, and the present invention can be implemented in other specific forms without departing from the spirit or basic characteristics of the present invention. Therefore, the embodiments should be exemplary and non-restrictive. The scope of the present invention is defined by the appended claims rather than the above description, and therefore, is intended to include all changes falling within the meaning and scope of equivalent elements of the claims. Any reference numerals in the claims should not be construed as a limitation to the claims involved.

What is claimed is:

1. A modified-material-based high-precision combined antenna for satellite navigation and communications, comprising:
    a high-frequency satellite navigation antenna metal radiating surface,
    a low-frequency satellite navigation antenna metal radiating surface,
    a WIFI/Bluetooth antenna metal radiating surface,
    a PCB, and
    a shielding metal cavity;
    wherein
    the low-frequency satellite navigation antenna metal radiating surface is located between the high-frequency satellite navigation antenna metal radiating surface and the PCB; and
    the WIFI/Bluetooth antenna metal radiating surface is located on a side of the low-frequency satellite navigation antenna metal radiating surface.

2. The modified-material-based high-precision combined antenna according to claim 1, further comprising: an injection molded modified-material-based substrate;
    wherein the injection molded modified-material-based substrate is made of polyphenyl ether doped with a modified material, and the modified material has a relative permittivity of 2.65 and a density of 1.06 g/cm$^3$; and
    the injection molded modified-material-based substrate comprises a first injection molded modified-material-based substrate and a second injection molded modified-material-based substrate.

3. The modified-material-based high-precision combined antenna according to claim 2, wherein,
    the high-frequency satellite navigation antenna metal radiating surface is electroplated on the first injection molded modified-material-based substrate to form a high-frequency substrate board, and
    the low-frequency satellite navigation antenna metal radiating surface is electroplated on the second injection molded modified-material-based substrate to form a low-frequency substrate board.

4. The modified-material-based high-precision combined antenna according to claim 3, wherein,
    each of the high-frequency satellite navigation antenna metal radiating surface and the low-frequency satellite navigation antenna metal radiating surface comprises a polygon, wherein a side of the polygon extends out to form a branch for a frequency adjustment.

5. The modified-material-based high-precision combined antenna according to claim 4, wherein,
    the high-frequency substrate board and the low-frequency substrate board are installed in combination;
    each of four corners of the high-frequency substrate board has a 2 mm screw hole, and a center of the high-frequency substrate board has a 4 mm screw hole; and
    the high-frequency substrate board and the low-frequency substrate board are fixed to the PCB through screws.

6. The modified-material-based high-precision combined antenna according to claim 5, wherein,
    a reverse side of the high-frequency substrate board is plated with metal and configured as a first ground plane;
    an inner wall of the 4 mm screw hole is plated with metal and contacts the first ground plane;
    four first through-holes are formed 8 mm from the center of the high-frequency substrate board, and
    a first metal round pin is welded to the four first through-holes and used as a first antenna feed.

7. The modified-material-based high-precision combined antenna according to claim 6, wherein,
    a reverse side of the low-frequency substrate board is entirely plated with metal and configured as a second ground plane, and a shape of the reverse side of the low-frequency substrate board is the same as a shape of the low-frequency substrate board;
    an inner wall of a screw hole in a center of the low-frequency substrate board is plated with metal and contacts the second ground plane;
    four second through-holes are formed 15 mm from the center of the low-frequency substrate board, and
    a second metal round pin is welded to the four second through-holes and used as a second antenna feed.

8. The modified-material-based high-precision combined antenna according to claim 7, wherein,
    the WIFI/Bluetooth antenna metal radiating surface is electroplated on a side of a low-frequency substrate.

9. The modified-material-based high-precision combined antenna according to claim 8, wherein,
    a WIFI/Bluetooth antenna is a passive antenna with an inverted-F antenna structure, and
    the WIFI/Bluetooth antenna has a short-circuit point and a feed point.

10. The modified-material-based high-precision combined antenna according to claim 8, further comprising: a PCB feed network and an amplifying filter circuit;
    wherein the amplifying filter circuit comprises a pre-filter and a two-stage amplifier; and
    a signal is synthesized after a high-frequency signal and a low-frequency signal separately pass through the pre-filter and a first-stage amplifier of the two-stage amplifier, and then the signal is output through a second-stage amplifier of the two-stage amplifier, wherein a satellite navigation receiver obtains a pre-filtered and amplified signal with predetermined satellite signal strength.

* * * * *